United States Patent [19]
Kajita

[11] Patent Number: 5,468,664
[45] Date of Patent: Nov. 21, 1995

[54] METHOD OF MAKING SEMICONDUCTOR DEVICE WITH ALIGNMENT MARKS

[75] Inventor: Tatsuya Kajita, Tokyo, Japan

[73] Assignee: Fujitsu Limited, Kanagawa, Japan

[21] Appl. No.: 342,021

[22] Filed: Nov. 16, 1994

Related U.S. Application Data

[62] Division of Ser. No. 932,728, Aug. 24, 1992, Pat. No. 5,391,902, which is a continuation of Ser. No. 524,767, May 17, 1990, abandoned.

[30] Foreign Application Priority Data

May 20, 1989 [JP] Japan ..................................... 1-127502

[51] Int. Cl.[6] ............................................. H01C 21/8247
[52] U.S. Cl. .......................... 437/43; 437/228; 437/924; 148/DIG. 102; 257/757
[58] Field of Search ............................ 437/43, 924, 228; 148/DIG. 102; 257/757

[56] References Cited

U.S. PATENT DOCUMENTS

| | | |
|---|---|---|
| 4,213,139 | 7/1980 | Rao . |
| 4,319,263 | 3/1982 | Rao . |
| 4,517,729 | 5/1985 | Batra . |
| 4,758,529 | 7/1988 | Ipri . |
| 4,816,885 | 3/1989 | Yoshida et al. . |
| 4,821,092 | 4/1989 | Noguchi . |
| 4,839,705 | 6/1989 | Tigelaar et al. . |
| 4,861,730 | 8/1989 | Hsia et al. . |
| 4,886,977 | 12/1989 | Gofuku et al. . |
| 4,935,792 | 6/1990 | Tanaka et al. . |
| 5,061,654 | 10/1991 | Shimizu et al. .......................... 437/70 |
| 5,158,902 | 10/1992 | Hanada ..................................... 437/43 |

FOREIGN PATENT DOCUMENTS

| | | |
|---|---|---|
| 0139764 | 3/1984 | European Pat. Off. . |
| 0339315 | 4/1989 | European Pat. Off. . |
| 3106202A1 | 12/1981 | Germany . |
| 60-224278 | 11/1985 | Japan . |
| 61-61467 | 3/1986 | Japan . |
| 63-185065 | 7/1988 | Japan . |
| 63-168052 | 7/1988 | Japan . |
| 63-308384 | 12/1988 | Japan . |
| 1-4070 | 1/1989 | Japan . |
| 1-390067 | 2/1989 | Japan . |
| 1-276737 | 11/1989 | Japan . |

Primary Examiner—Olik Chaudhuri
Assistant Examiner—Richard A. Booth
Attorney, Agent, or Firm—Nikaido, Marmelstein, Murray & Oram

[57] ABSTRACT

A semiconductor device includes a base layer, a chip region formed on the base layer, a peripheral region which surrounds the chip region on the base layer, and a patterned stacked structure formed on the base layer in both the chip region and the peripheral region. The patterned stacked structure includes a lower layer which is formed on the base layer, an intermediate layer which is formed on the lower layer and an upper layer formed on the intermediate layer. The upper layer and the intermediate layer are aligned to one side surface of the lower layer in at least a part of the chip region. The intermediate layer and the upper layer cover one side surface of the lower layer in at least a part of the peripheral region.

15 Claims, 8 Drawing Sheets

METHOD OF MAKING SEMICONDUCTOR DEVICE WITH ALIGNMENT MARKS

This is a divisional, of application Ser. No. 07/932,728 filed Aug. 24, 1992, now U.S. Pat. No. 5,391,902 which is a continuation of application Ser. No. 07/524,767 filed on May 17, 1990, now abandoned.

BACKGROUND OF THE INVENTION

The present invention generally relates to semiconductor devices and production methods thereof, and more particularly to a semiconductor device such as an electrically programmable read only memory (EPROM) which has upper and lower conductor layers having an insulator layer interposed therebetween and a method of producing such a semiconductor device including a process of patterning the upper and lower conductor layers by a kind of self-alignment.

With the increase in the integration density of semiconductor devices, there are now more strict demands to reduce the area occupied by each element of the semiconductor device. In order to satisfy such demands and to form fine patterns with a high accuracy, it is becoming essential to make a self-alignment patterning using an anisotropic dry etching.

First, a description will be given of an example of a conventional method of patterning using the anisotropic dry etching. In FIG. 1A, a lower layer 20 is formed on a substrate 80, and an upper layer 30 is formed on the lower layer 20 and the substrate 80. When a resist mask layer 60 is formed on the upper layer 30 and a patterning is made using anisotropic dry etching, a portion of the upper layer 30 remains at the stepped portion as a side wall portion 31 as shown in FIG. 1B. This side wall portion 31 is often used effectively as an insulator layer, a mask which is used when implanting impurities and the like.

On the other hand, there are cases where the upper and lower layers 30 and 20 are made of materials having large etching rates. In such cases, when the upper and lower layers 30 and 20 shown in FIG. 2A are patterned by a kind of self-alignment, a side wall portion 32 may remain after the patterning as shown in FIG. 2B. This side wall portion 32 may come off the substrate 80 during subsequent processes and adhere on another part of the substrate 80. In other words, the side wall portion 32 may become a contamination source and interfere or prevent the formation of fine patterns on the surface of the substrate 80.

A more detailed description will be given of the above described problems encountered in storage and control electrodes of an EPROM, by referring to FIG. 3. FIG. 3 shows a cross section of an essential part of a storage transistor in the so-called FLOTOX type EPROM. A storage electrode 52 which is made of a polysilicon layer, for example, is formed on a semiconductor substrate 1 via a gate insulator layer 51. A control electrode 53 is formed on the storage electrode 52 via an insulator layer 54 which is made of $Si_3N_4$, for example. A source/drain region 56, an interlayer insulator 57 and an interconnection layer 58 are formed as shown.

A stepped portion of some sort always exists on the substrate 1 (semiconductor chip). For example, an alignment mark which is made of polysilicon as in the case of the storage electrode 52 is formed at a peripheral region of the chip, and a stepped portion is formed by the provision of this alignment mark. For this reason, when the insulator layer 54 and an upper polysilicon layer which constitutes the control electrode 53 are successively formed on the alignment mark and the upper polysilicon layer and a lower polysilicon layer which constitutes the alignment mark are patterned by self-alignment at the same time as forming of the storage and control electrodes 52 and 53, a $Si_3N_4$ side wall portion is formed as described above. If a stepped portion exists in the lower polysilicon layer within the chip region, an isolated $Si_3N_4$ side wall portion is formed similarly.

Therefore, when an isolated side wall portion is generated in the above described manner, there is a problem in that it is impossible to pattern the storage and control electrodes 52 and 53 by self-alignment unless a measure is taken to prevent the side wall portion from coming off the substrate in a latter process. As a result, the integration density cannot be improved.

A Japanese Laid-Open Patent Application No. 1-276737 proposes a method of producing a semiconductor device, in which at least a peripheral portion of a first layer, which constitutes a mark pattern, is covered by a second layer. However, there is no suggestion in this proposal to eliminate the problems of the side wall portion when patterning the upper and lower polysilicon layers by self-alignment.

When patterning the stacked structure which includes a lower layer, an interlayer insulator and an upper layer which are formed in this sequence, the interlayer insulator is etched by an anisotropic etching. If the stacked structure were etched by an isotropic etching, the edge of the interlayer insulator would be etched further towards the inside compared to the upper and lower layers. For this reason, isotropic etching cannot be applied to the interlayer insulator, and anisotropic etching must be used for the interlayer insulator. A side wall portion of the interlayer insulator will be generated by anisotropic etching.

In order to prevent the generation of the side wall portion of the interlayer insulator, it is possible to take one of the following three measures. According to a first measure, the edge of the lower layer is completely covered by the interlayer insulator and the upper layer covers the interlayer insulator in its entirety. According to a second measure, the edge of the lower layer is patterned to have a downwardly spreading taper, and the edge of the lower layer is completely covered by the interlayer insulator which is covered by the upper layer in its entirety. According to a third measure, the edge of the lower layer is not self-aligned, and the edges of the interlayer insulator and the upper layer are located on the inside of the edge of the lower layer.

The first and third measures require positioning margin for the upper and lower layers, and it is impossible to form fine patterns. On the other hand, it is difficult to control the width of the lower layer when the second measure is taken, and the width of the lower layer cannot be made extremely small because of the tapered edge.

Therefore, in order to form fine patterns, it is necessary to pattern the upper and lower layers by a self-alignment. In addition, to prevent the problem introduced when the second measure is taken, the lower layer must be patterned by anisotropic etching.

SUMMARY OF THE INVENTION

Accordingly, it is a general object of the present invention to provide a novel and useful semiconductor device and production method thereof, in which the problems described above are eliminated.

Another and more specific object of the present invention is to provide a semiconductor device comprising a base layer, a chip region formed on the base layer, a peripheral region which surrounds the chip region on the base layer, and a patterned stacked structure formed on the base layer in both the chip region and the peripheral region, where the patterned stacked structure includes a lower layer which is formed on the base layer, an intermediate layer which is formed on the lower layer and an upper layer formed on the intermediate layer. The upper layer and the intermediate layer are aligned to one side surface of the lower layer in at least a part of the chip region, and the intermediate layer and the upper layer cover one side surface of the lower layer in at least a part of the peripheral region. According to the semiconductor device of the present invention, it is possible to prevent a side wall layer made up of the intermediate layer from coming off the base layer in the peripheral region. As a result, it is possible to improve the production yield and reduce the cost of the semiconductor device.

Still another object of the present invention is to provide a method of producing a semiconductor device comprising the steps of preparing a stacked structure including a base layer, a patterned lower layer formed on a surface of the base layer, an intermediate layer which covers the surface of the base layer in its entirety including the lower layer, and an upper layer which covers a surface of the intermediate layer in its entirety, where the lower layer has an etching rate greater than an etching rate of the intermediate layer, patterning the upper and lower layers in a chip region on the base layer so that the upper layer and intermediate layer are aligned to one side surface of the lower layer in at least a part of the chip region, and patterning the upper layer in a peripheral region so that the intermediate layer and the upper layer cover one side surface of the lower layer in at least a part of the peripheral region which surrounds the chip region on the base layer. According to the method of the present invention, it is possible to improve the integration density and production yield of the semiconductor device, as well as reducing the production cost.

A further object of present invention is to provide a method of producing a semiconductor device comprising the steps of forming a lower layer on a surface of a base layer, patterning the lower layer to expose side surfaces of the lower layer and parts of the surface of the base layer, forming an intermediate layer which covers the surface of the base layer in its entirety including the lower layer, where the intermediate layer has an etching rate smaller than an etching rate of the lower layer, forming an upper layer which covers a surface of the intermediate layer in its entirety, and patterning the upper layer so that the upper layer and the intermediate layer are aligned to one side surface of the lower layer in at least a part of a chip region on the base layer and the intermediate layer and the upper layer cover one side surface of the lower layer in at least a part of a peripheral region which surrounds the chip region on the base layer. According to the method of the present invention, it is possible to improve the integration density and production yield of the semiconductor device, as well as reducing the production cost.

Other objects and further features of the present invention will be apparent from the following detailed description when read in conjunction with the accompanying drawings.

DESCRIPTION OF THE PREFERRED EMBODIMENTS

Figure 4A:
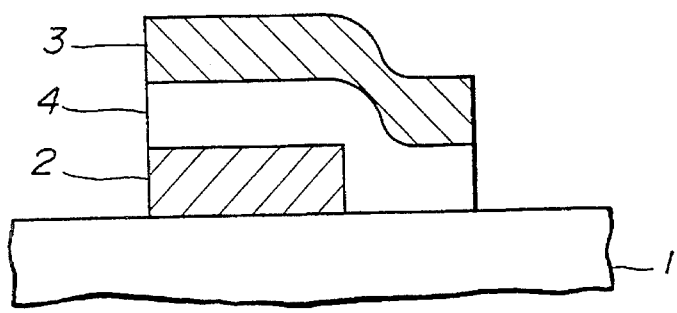
FIGS. 4A through 4C are cross sectional views for explaining an embodiment of a semiconductor device according to the present invention.
Figure 4B:
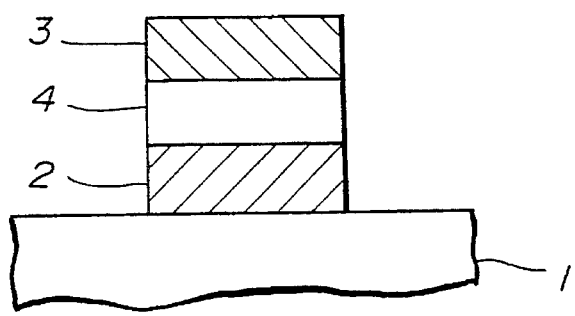
Figure 4C:
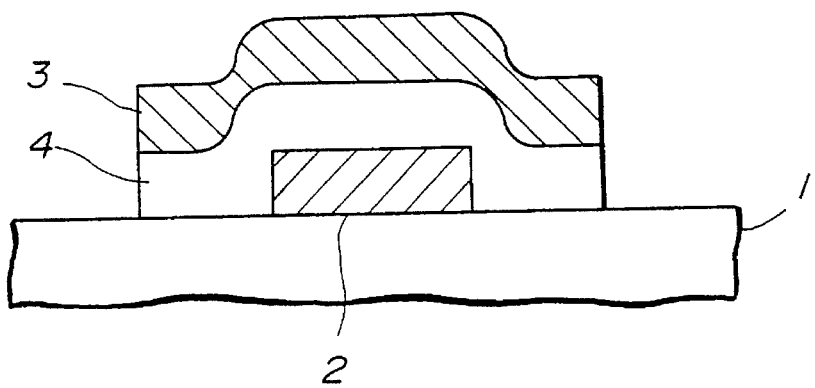

First, a description will be given of an embodiment of a semiconductor device according to the present invention, by referring to FIGS. 4A through 4C. FIGS. 4A through 4C respectively show a stacked structure having a substrate 1 such as a silicon wafer, a lower layer 2 formed on the substrate 1, an intermediate layer 4 formed on the lower layer 2, and an upper layer 3 formed on the intermediate layer 4.

In FIG. 4A, the upper layer 3 covers a portion of one side surface of the lower layer 2 while the other side surface of the lower layer 2 is patterned together with the upper layer 3 by a kind of self-alignment.

In FIG. 4B, both side surfaces of the lower layer 2 are patterned together with the upper layer 3 by the self-alignment.

In FIG. 4C, the upper layer 3 covers both side surfaces of the lower layer 2.

According to this embodiment of the semiconductor device, at least the stacked structure shown in FIG. 4A or 4B exists within the chip area, while at least the stacked structure shown in FIG. 4A or 4C exists in the peripheral region of the chip. In other words, in the peripheral region, the upper layer 3 covers a portion of or all of the side surfaces at the stepped portions of the lower layer 2. On the other hand, in the chip region, a portion of or all of the patterns made up of the upper and lower layers 3 and 2 are patterned by the self-alignment.

Next, a description will be given of an embodiment of a method of producing a semiconductor device according to the present invention, by referring to FIGS. 5A through 5C.

Figures 5A, 5B, 5C:
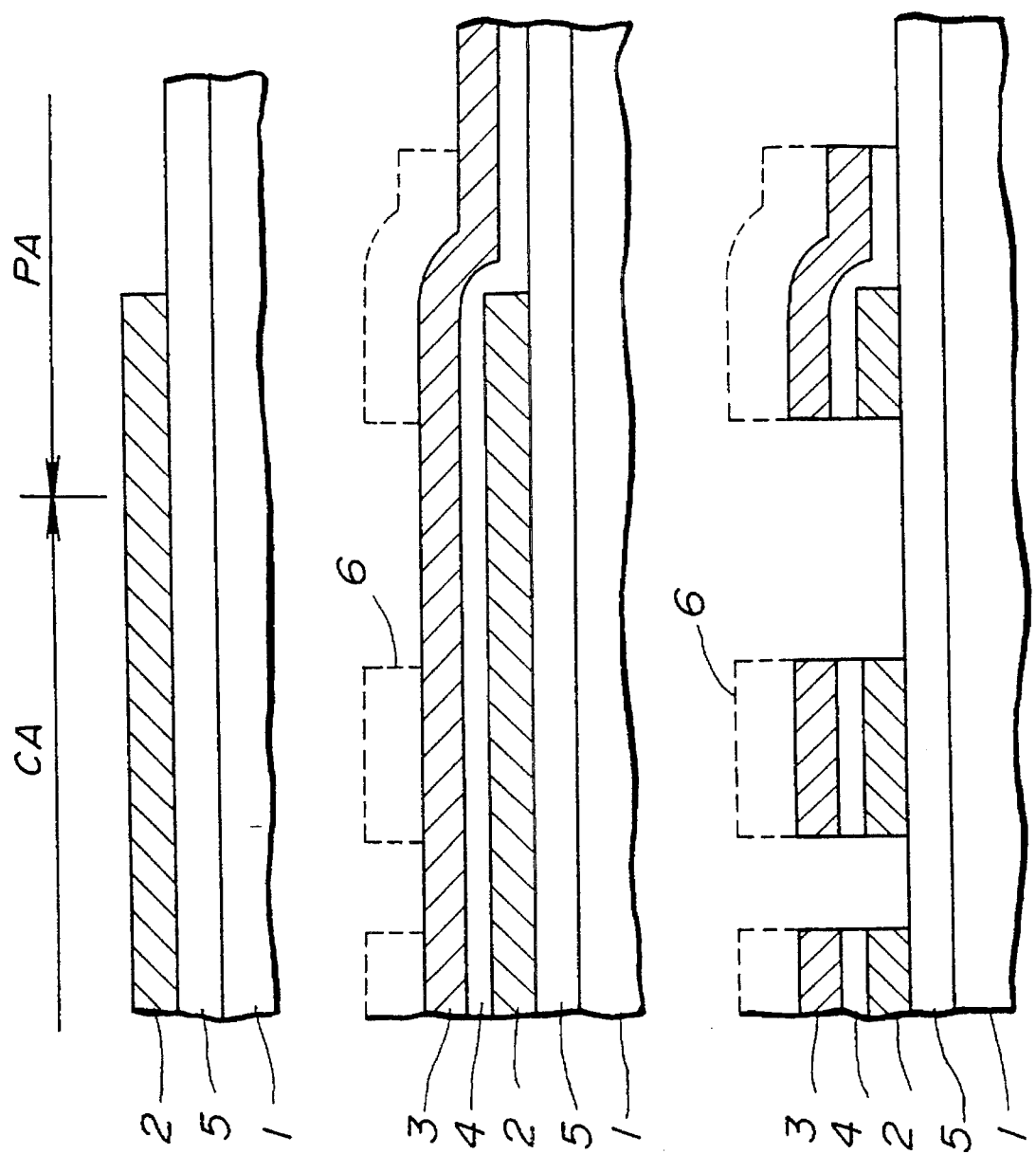
FIGS. 5A through 5C are cross sectional views for explaining an embodiment of a method of producing a semiconductor device according to the present invention.

As shown in FIG. 5A, the surface of the substrate 1 such as the silicon wafer is thermally oxidized to form a $SiO_2$ insulator layer 5. Then, the polysilicon lower layer 2 is formed by a known chemical vapor deposition (CVD). The lower layer 2 is selectively masked by a resist layer (not shown), and the lower layer 2 is partially removed in a peripheral region PA. In other words, the lower layer 2 is patterned by anisotropic etching. This process corresponds to patterning of the alignment mark described before. In FIG. 5A, CA denotes a chip region.

Next, as shown in FIG. 5B, a known CVD is used to successively form a $Si_3N_4$ intermediate layer 4 and a polysilicon upper layer 3 on the entire surface of the substrate 1, and a resist layer 6 is formed on the upper layer 3. The resist layer 6 is formed so as to mask the stepped portion of the lower layer 2 in the peripheral region PA.

Then, as shown in FIG. 5C, a known anisotropic dry etching is used to successively etch the upper layer 3, the intermediate layer 4 and the lower layer 2 which are exposed through openings in the resist layer 6.

Figure 1A:
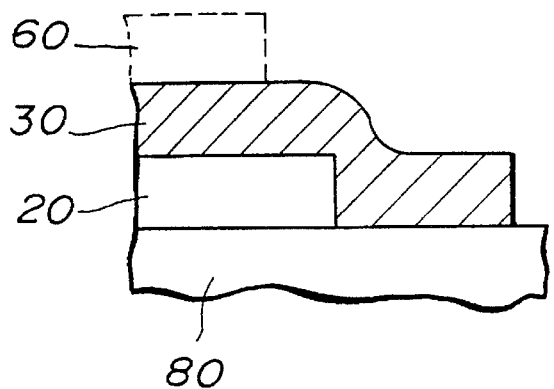
FIGS. 1A and 1B are cross sectional views for explaining an example of a conventional method of patterning using the anisotropic dry etching.
Figure 1B:
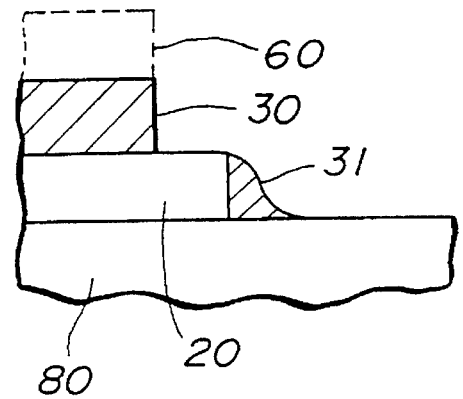
Figure 2A:
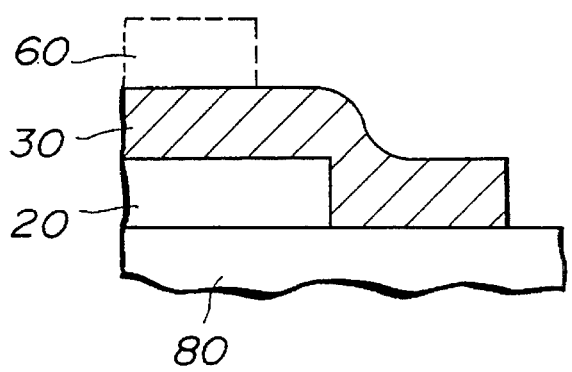
FIGS. 2A and 2B are cross sectional views for explaining another example of the conventional method of patterning upper and lower layers having large etching rates.
Figure 2B:
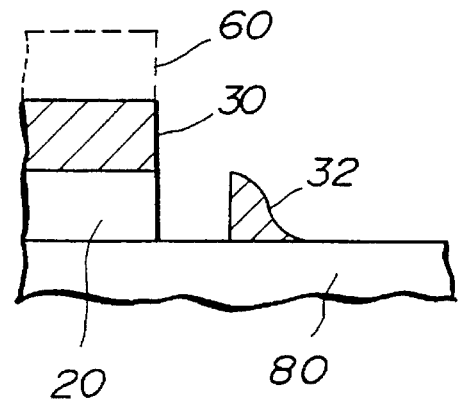

As a result, the pattern shown in FIG. 4B is formed in the chip region CA, and the pattern shown in FIG. 4A is formed in the peripheral region PA. Because the upper layer 3 and the intermediate layer 4 are not etched at the stepped portion of the lower layer 2, no isolated side wall portion is generated as described before in conjunction with FIGS. 2A and 2B.

When simultaneously etching the upper and lower layers 3 and 2, it is desirable that the etching rate of the upper layer 3 is greater than the etching rate of the lower layer 2 and the etching rate of the lower layer 2 is set greater than the etching rate of the intermediate layer 4. In addition, the etching rate of the insulator layer 5 is set greater than the etching rate of the intermediate layer 4.

However, the etching rate of the upper layer 3 need not be greater than that of the lower layer 2 if no side wall portion of the upper layer 3 would remain on the intermediate layer 4 after the etching. For example, even when the upper and lower layers 3 and 2 have the same etching rate, no side wall portion of the upper layer 3 would remain after the etching if the upper and lower layers 3 and 2 have the same thickness.

For example, the upper and lower layers 3 and 2 may be made of a material selected from a group including polysilicon and polycide. The insulator layer 5 may be made of a material selected from a group including $SiO_2$. The intermediate layer 4 may be made of a material selected from a group including SiN and $Ta_2O_3$.

Next, a description will be given of the formation of a specific pattern by patterning the upper and lower layers 3 and 2 with self-alignment, by referring to FIGS. 6A through 6C.

For example, a $SiO_2$ layer which becomes a gate insulator layer is formed on a substrate such as a silicon wafer, and a polysilicon layer is formed on the surface of the substrate to a thickness of 100 to 500 nm. Then, this structure is patterned as shown in FIG. 6A. In FIG. 6A, the polysilicon lower layer 2 is removed except for the portion within the chip region CA and the portion above an alignment mark AM within the peripheral region PA. In other words, the lower layer 2 is patterned by anisotropic etching. The alignment mark AM is normally arranged on a scribe line SL. Openings 21 and 22 are formed in the lower layer 2 and these openings 21 and 22 reach the $SiO_2$ layer.

A $Si_3N_4$ intermediate layer having a thickness of 10 to 50 nm and a polysilicon upper layer having a thickness of 100 to 500 nm are successively formed on the entire substrate surface. Thereafter, a resist layer 7 is formed on the upper layer as shown in FIG. 6B. A resist layer portion $7_1$ of the resist layer 7 masks the stepped portion of the lower layer 2 at the periphery of the chip region CA. A resist layer portion $7_2$ of the resist layer 7 extends across the opening 21. A resist layer portion $7_3$ of the resist layer 7 masks the stepped portion of the lower layer 2 within the opening 22. A resist layer portion $7_4$ of the resist layer 7 masks an isolated portion of the substrate surface exposed within the opening 22. In addition, resist layer portions $7_5$ and $7_6$ of the resist layer 7 respectively mask a portion of or all of the stepped portion of the lower layer 2 making up the alignment mark AM.

A known anisotropic dry etching is used to remove the upper layer which is exposed through the openings in the resist layer 7, and to thereafter remove the intermediate layer and the lower layer 2 which are exposed through the openings in the resist layer 7. As a result, patterns $8_1$ through $8_6$ in which at least the uppermost layer is made of polysilicon are formed as shown in FIG. 6C.

A description will now be given of cross sections of the patterns $8_1$ through $8_6$ by comparing FIG. 6C with FIGS. 7A through 7G. In FIGS. 7A through 7G, it is assumed that a $SiO_2$ layer (not shown) which becomes the gate insulator layer covers the surface of the substrate 1.

Figure 6A:
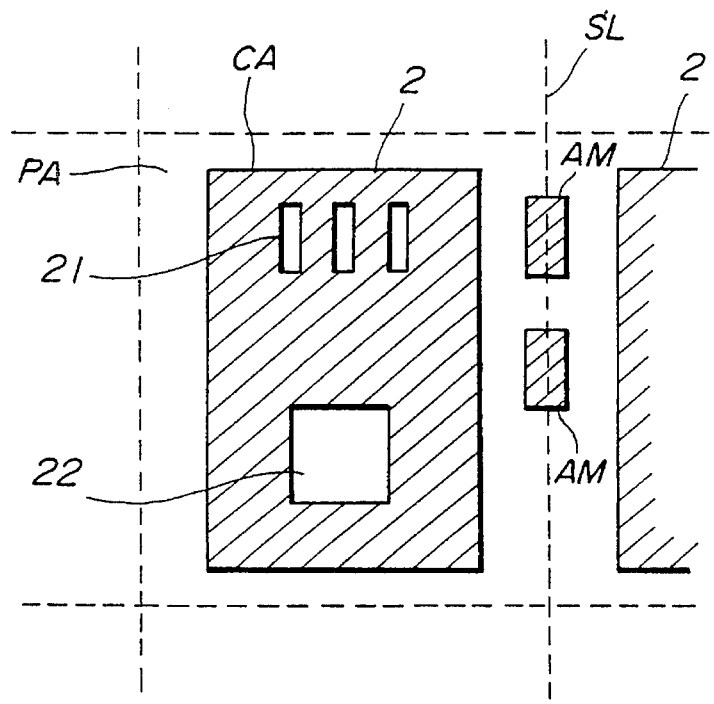
FIGS. 6A through 6C are plan views for explaining the formation of a specific pattern.
Figure 6B:
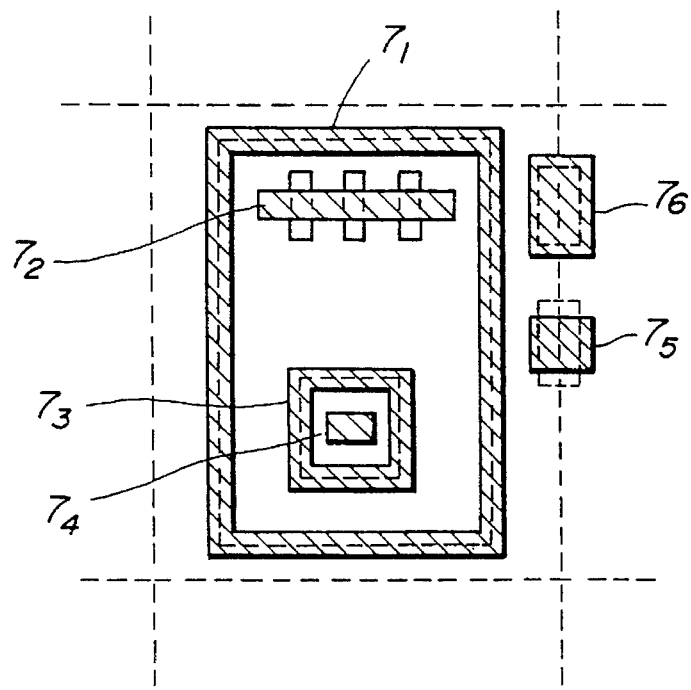
Figure 6C:
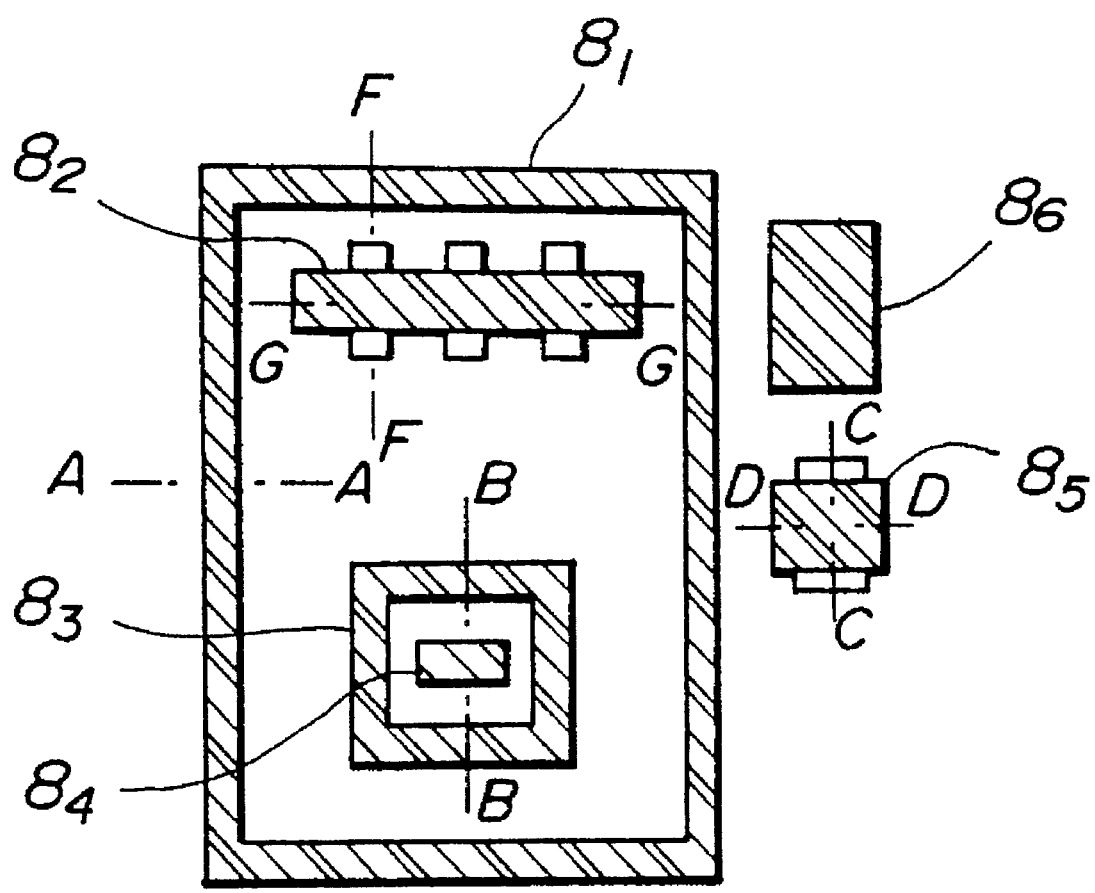
Figure 7A:
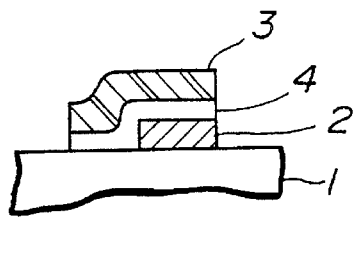
FIGS. 7A through 7G are cross sectional views at various parts of the structure shown in FIG. 6C.

A cross section of the pattern $8_1$ along a line A—A in FIG. 6C is as shown in FIG. 7A. In FIG. 7A, there is a portion where the stepped portion of the lower layer 2 is covered by the upper layer 3, and there is a portion where the upper and lower layers 3 and 2 are patterned by the self-alignment. In other words, the structure shown in FIG. 7A corresponds to the structure shown in FIG. 4A. Although the pattern $8_1$, which does not form an element, is formed in the periphery of the chip region CA, no serious problems are introduced from the point of view of utilizing efficiency of the chip area.

Figure 7B:
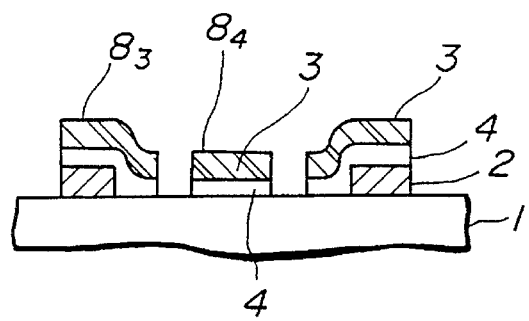

A cross section of the patterns $8_3$ and $8_4$ along a line B—B in FIG. 6C becomes as shown in FIG. 7B. The pattern $8_3$ forms the structure shown in FIG. 4A and surrounds the pattern $8_4$. The pattern $8_4$ is made up of the upper layer 3 which makes contact with the substrate 1 via the intermediate layer 4. This pattern $8_4$ is used for a gate electrode of a transistor which makes up an input/output circuit provided in the periphery of the chip region CA. Since the number of such transistors is small, the existence of the pattern $8_3$ which does not form an element in the periphery of these transistors does not introduce serious problems from the point of view of utilizing efficiency of the chip area.

Figure 7C:
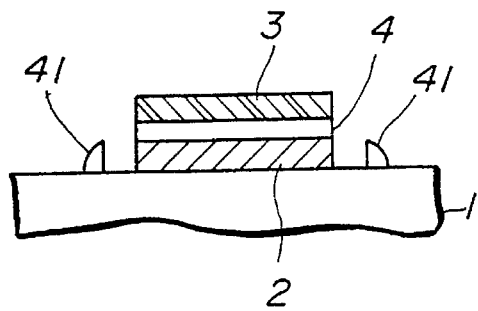
Figure 7D:
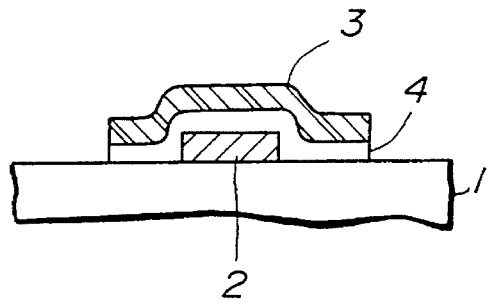
Figure 7E:
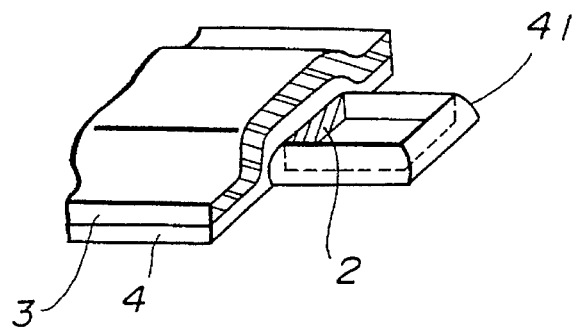

Cross sections of the patterns $8_5$ along lines C—C and D—D in FIG. 6C are respectively shown in FIGS. 7C and 7D. The structures shown in FIGS. 7C and 7D respectively correspond to the structures shown in FIG. 4B and 4C. The pattern $8_5$ is patterned so that a portion of the upper layer 3 above the stepped portion of the lower layer 2 constituting the alignment mark AM is removed by an etching. For this reason, a side wall portion 41 which is isolated from the intermediate layer 4 is generated in the cross section along the line C—C as shown in FIG. 7C. However, as shown in FIG. 7E which shows a perspective view of this side wall portion 41, the extension of the side wall portion 41 is covered by the upper layer 3 and will not come off during the latter process. Of course, a cross section of the pattern $8_6$ also has the structure shown in FIG. 7D.

Figure 7F:
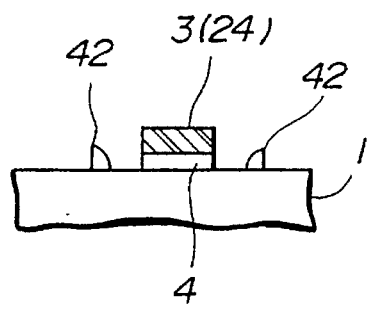
Figure 7G:
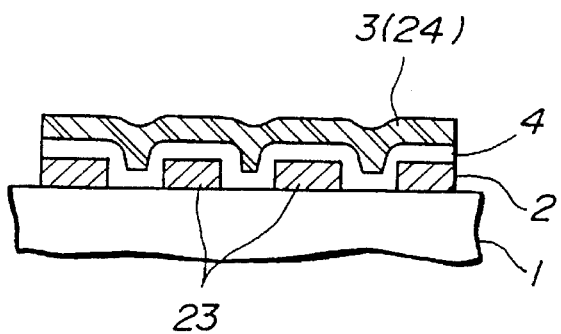

Cross sections of the pattern $8_2$ along lines F—F and G—G in FIG. 6C respectively are as shown in FIGS. 7F and 7G. In the cross section along the line F—F shown in FIG. 7F, an isolated side wall portion 42 is also formed, but an extension of this side wall portion 42 is covered by the upper layer 3 which prevents the side wall portion 42 from coming off.

Figure 3:
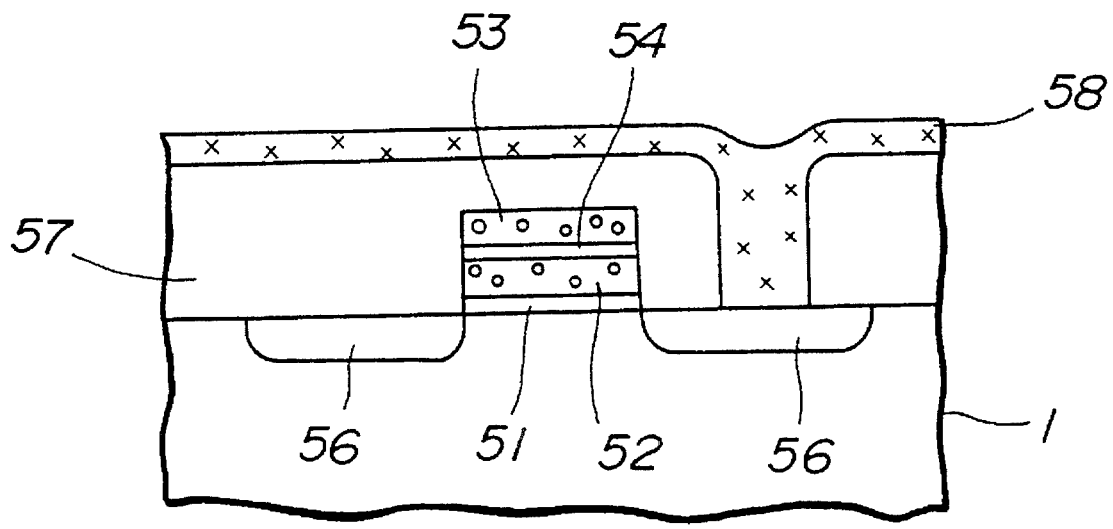
FIG. 3 is a cross sectional view showing an essential part of a FLOTOX type EEPROM.

As shown in FIG. 7F, the upper layer 3 which forms the pattern $8_2$ makes contact with the substrate 1 via the intermediate layer 4 within a region which corresponds to the opening 21 shown in FIG. 6A. On the other hand, in a region between the openings 21 shown in FIG. 6A, the upper and lower layers 3 and 2 are patterned by self-alignment as shown in the cross section along the line G—G in FIG. 7G and the lower layer 2 becomes an isolated layer 23. In addition, the upper layer 3 becomes a continuous layer 24 which extends across the isolated layers 23. This structure can thus be used for the EPROM. In other words, the isolated layers 23 can be used as the storage electrodes, and the continuous layer 24 which extends in one direction can be used as the common control electrode. Therefore, it is possible to obtain the storage electrode 52 and the control electrode 53 which are patterned by self-alignment as shown in FIG. 3.

The present invention is not limited to the application to EPROMs. The present invention can be applied similarly to any semiconductor devices having a floating gate, such as an electrically erasable PROM (EEPROM).

In the described embodiments, the upper layer 3, the intermediate layer (interlayer insulator) 4 and the lower layer 2 are etched with self-alignment using anisotropic dry etching. However, only the intermediate layer 4 needs to be etched by anisotropic etching for the reasons described before. Any suitable etching may be used for the upper and lower layers 3 and 2. In other words, the upper layer 3 may be etched by anisotropic etching or isotropic etching, and the lower layer 2 may similarly be etched by anisotropic etching or isotropic etching, as long as the intermediate layer 4 is etched by anisotropic etching.

Further, the present invention is not limited to these embodiments, but various variations and modifications may be made without departing from the scope of the present invention.

What is claimed is:

1. A method of producing a semiconductor device comprising the steps of:

preparing a stacked structure including a base layer, a patterned lower layer formed on a surface of said base layer, an intermediate layer which covers the surface of said base layer in its entirety including said lower layer, and an upper layer which covers a surface of said intermediate layer in its entirety, said lower layer having an etching rate greater than an etching rate of said intermediate layer;

patterning said upper and lower layers in a chip region containing electrically coupled elements that form part of an electric circuit on said base layer so that said upper layer and said intermediate layer are aligned to one side surface of said lower layer in at least a part of said chip region; and patterning said upper layer in a peripheral region including no elements which form said electric circuit so that said intermediate layer and said upper layer cover one side surface of said lower layer in at least a part of said peripheral region, said peripheral region surrounding said chip region on said base layer.

2. The method as claimed in claim 1 wherein said base layer is formed on a substrate, said base layer having an etching rate greater than the etching rate of said intermediate layer.

3. The method as claimed in claim 1 wherein said upper layer has an etching rate greater than an etching rate of said lower layer.

4. The method as claimed in claim 1 wherein said upper and lower layers are made of a material selected from a group consisting of polysilicon and polycide.

5. The method as claimed in claim 1 wherein said base layer is $SiO_2$.

6. The method as claimed in claim 1 wherein said intermediate layer is made of a material selected from a group consisting of SiN and $Ta_2O_3$.

7. The method as claimed in claim 1 wherein said two patterning steps use an anisotropic dry etching for etching at least said intermediate layer.

8. A method of producing a semiconductor device comprising the steps of:

forming a lower layer on a surface of a base layer;

patterning said lower layer to expose side surfaces of said lower layer and parts of the surface of said base layer;

forming an intermediate layer which covers the surface of said base layer in its entirety including said lower layer, said intermediate layer having an etching rate smaller than an etching rate of said lower layer;

forming an upper layer which covers a surface of said intermediate layer in its entirety; and patterning said upper layer so that said upper layer and said intermediate layer are aligned to one side surface of said lower layer in at least a part of a chip region containing electrically coupled elements that form part of an electric circuit on said base layer and said intermediate layer and said upper layer cover one side surface of said lower layer in at least a part of a peripheral region which surrounds said chip region including no elements which form said electric circuit on said base layer.

9. The method as claimed in claim 8 wherein said base layer is formed on a substrate, said base layer having an etching rate greater than the etching rate of said intermediate layer.

10. The method as claimed in claim 8 wherein said upper layer has an etching rate greater than an etching rate of said lower layer.

11. The method as claimed in claim 8 wherein said upper and lower layers are made of a material selected from a group consisting of polysilicon and polycide.

12. The method as claimed in claim 8 wherein said base layer is $SiO_2$.

13. The method as claimed in claim 8 wherein said intermediate layer is made of a material selected from a group consisting of SiN and $Ta_2O_3$.

14. The method as claimed in claim 8 wherein said two patterning steps use an anisotropic dry etching for etching at least said intermediate layer.

15. The method as claimed in claim 8 wherein said step of patterning said upper layer intensionally leaves a patterned stacked structure on said base layer in said peripheral region, said intermediate layer and said upper layer of said patterned stacked structure covering at least one side surface of said lower layer.

* * * * *